(12) United States Patent (10) Patent No.: US 8,445,184 B2
Matsuda (45) Date of Patent: May 21, 2013

(54) PATTERN FORMATION METHOD (75) Inventor: Takashi Matsuda, Toyoma (JP)

(73) Assignee: Panasonic Corporation, Osaka (JP)

( * ) Notice: Subject to any disclaimer, the term of this patent is extended or adjusted under 35 U.S.C. 154(b) by 262 days.

(21) Appl. No.: 13/010,355

(22) Filed: Jan. 20, 2011

(65) Prior Publication Data
US 2011/0281220 A1 Nov. 17, 2011

(30) Foreign Application Priority Data
May 11, 2010 (JP) ................................. 2010-109193

(51) Int. Cl.
G03F 7/26 (2006.01)
(52) U.S. Cl.
USPC .......................................... 430/313; 430/311
(58) Field of Classification Search
USPC ................................................ 430/311, 313
See application file for complete search history.

(56) References Cited

U.S. PATENT DOCUMENTS 5,667,940 A * 9/1997 Hsue et al. ................... 430/312
7,488,685 B2 2/2009 Kewley
7,732,341 B2 6/2010 Koh et al.
2006/0017115 A1 * 1/2006 Tu et al. ........................ 257/371

FOREIGN PATENT DOCUMENTS
JP 2003-303824 10/2003

OTHER PUBLICATIONS

M. Maenhoudt et al., "Double Patterning scheme for sub-0.25 k1 single damascene structures at NA=0.75, λ + 193nm, " Proceedings of SPIE, vol. 5754 (2005), pp. 1508-1518.
A. Vanleenhove et al., "A litho-only approach to double Patterning," Proceedings of SPIE, vol. 6520, (2007), pp. 6520F-1-6520F-10.

* cited by examiner

Primary Examiner — Kathleen Duda
(74) Attorney, Agent, or Firm — McDermott Will & Emery LLP (57) ABSTRACT A first resist film is irradiated with first exposure light and performing first development, thereby forming a first pattern in a first region including an interconnect trench pattern and forming a dummy pattern in a second region connected to the first region and having a pattern density lower than that of the interconnect trench pattern. Then, the first resist film is hardened, and a second resist film is formed on the hardened first resist film. After that, the second resist film is irradiated with second exposure light and performing second development, thereby forming a second pattern in the first region. When forming the second pattern, an opening made of the first pattern and the second pattern and including the interconnect trench pattern is formed in the first region, whereas in the second region, an opening in the first dummy pattern is filled with the second resist film.

8 Claims, 5 Drawing Sheets

FIG.5E
PRIOR ART

PATTERN FORMATION METHOD

CROSS-REFERENCE TO RELATED APPLICATION

This application claims priority to Japanese Patent Application No. 2010-109193 filed on May 11, 2010, the disclosure of which including the specification, the drawings, and the claims is hereby incorporated by reference in its entirety.

BACKGROUND

The present disclosure relates to pattern formation methods in which patterns are formed by performing exposure twice or more on a single substrate.

In recent years, as the industry continues to progress in miniaturization of semiconductor devices to the utmost limit, it is becoming necessary to form a pattern with a size exceeding a resolution limit of optical lithography. A resolvable minimum pitch is represented by a limiting point in optical theory. Resolution is represented by the Rayleigh equation, i.e., $R = k1 \cdot \lambda/NA$ (where R represents a resolution size, $\lambda$ represents a light source wavelength, NA represents the numerical aperture, and k1 represents a process factor). For example, the minimum k1 is 0.25 in immersion exposure with water under the conditions where a light source wavelength $\lambda$, is 193 nm and the NA is 1.35. Thus, the resolution size R is 35.7 nm, and the limit pitch is 71.4 nm, which is twice as large as the resolution size R. However, a 22 nm generation device requires an interconnect pitch of 64 nm, which is not achieved by conventional exposure techniques. Under such circumstances, a so-called "double patterning" is suggested, in which patterns are formed individually in two exposure steps and then superimposed to double the pattern pitch.

One type of double patterning is a litho-etch-litho-etch (LELE) process in which exposure and etching are repeated twice (see, e.g., M. Maenhoudt et al., Double Patterning Scheme for Sub-0.25 k1 Single Damascene Structures at NA=0.75, $\lambda$=193 nm, Proceedings of SPIE, Vol. 5754, pp. 1508-1518 (2005)). A litho-process-litho-etch (LPLE) process is also suggested, in which a manufacturing process is simplified by eliminating an etching step (see, e.g., A. Vanleenhove et al., A Litho-Only Approach to Double Patterning, Proceedings of SPIE, Vol. 6520, pp. 65202F-1-65202F-10 (2007)).

SUMMARY

However, in the conventional double patterning, both in the LELE process and the LPLE process, when forming a second pattern on a first pattern, a step caused by a difference in the density in the first pattern leads to problems. Specifically, the step causes non-uniformity in the thickness of a resist film applied in second patterning, and thus, a desired pattern size cannot be obtained. In particular, this problem is significant when there are high- and low-density portions in a pattern, for example, in interconnect formation.

A pattern formation method and an interconnect formation method using a conventional LPLE process of double patterning will be described below with reference to FIGS. 5A-5E.

Figure 5A:
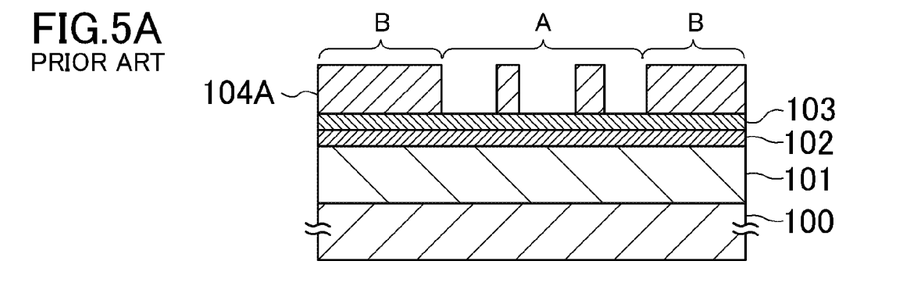
FIGS. 5A-5E are cross-sectional views illustrating a conventional pattern formation method in order of steps.

First, as shown in FIG. 5A, an interlayer insulating film 101 is deposited on a substrate 100, and a hard mask formation film 102 and an anti-reflection film 103 are formed on the deposited interlayer insulating film 101. Then, a first resist film is formed on the anti-reflection film 103 by applying resist, and subjected to first exposure and first development to form a first resist pattern 104A from the first resist film. The first resist pattern 104A is formed in a first region A having a relatively high-density pattern, and in a second region B having a lower density than the first region A. After that, the first resist pattern 104A is hardened by heat treatment.

Figure 5B:
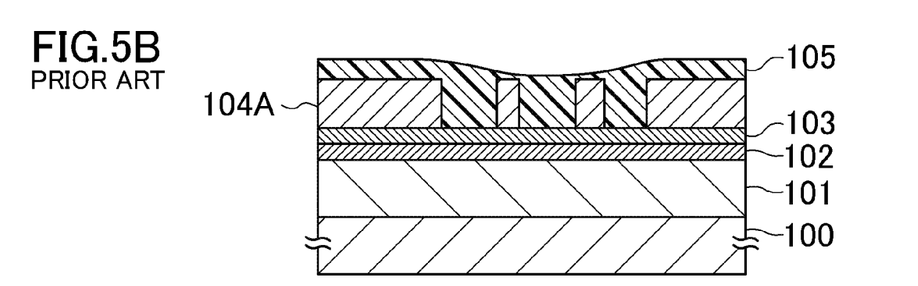

Next, as shown in FIG. 5B, a second resist film 105 is formed on the hardened first resist pattern 104A by applying resist. In the second region B, since the first resist pattern 104A exists as a foundation layer, the height of the surface of the second resist film 105 from the surface of the anti-reflection film 103 is great, and the second resist film 105 has a small thickness. On the other hand, in the first region A, due to an opening of the first resist pattern 104A which is a foundation layer, the height of the surface of the second resist film 105 from the surface of the anti-reflection film 103 is low, and the second resist film 105 has a large thickness in the space in the first resist pattern 104A near the boundary between the first region A and the second region B. As such, the thickness of the second resist film 105 varies depending on the density of the first resist pattern 104A.

Figure 5C:
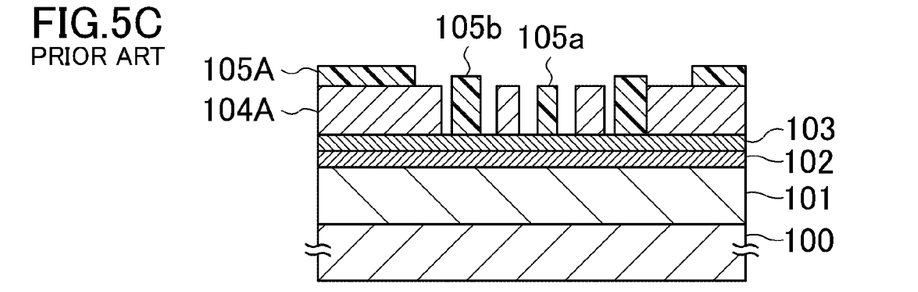

Then, as shown in FIG. 5C, the second resist film 105 is subjected to second exposure and second development to obtain a second resist pattern 105A. At this time, while the pattern 105a is finished with a desired size in the first region A, a pattern 105b formed at the boundary between the first region A and the second region B has a large thickness, and is thus finished with a size larger than desired.

Figure 5D:
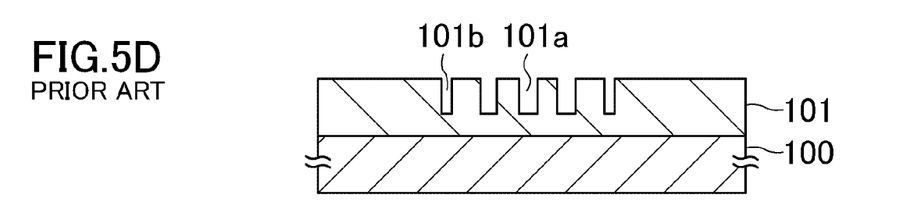

After that, the anti-reflection film 103 and the hard mask formation film 102 are etched using the first resist pattern 104A and the second resist pattern 105A as masks to form a hard mask. Then, the interlayer insulating film 101 is etched with the formed hard mask to form an interconnect trench pattern in the interlayer insulating film 101. After that, when the hard mask is removed, the state shown in FIG. 5D is obtained. In the central portion of the first region A, an interconnect trench pattern 101a in the interlayer insulating film 101 is finished with a desired size. On the other hand, an interconnect trench pattern 101b located at the boundary between the first region A and the second region B is formed with a size smaller than desired.

Figure 5E:
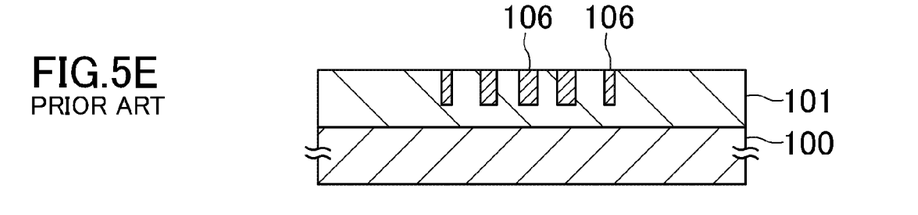

Next, as shown in FIG. 5E, a metal film for interconnect formation is formed on the interlayer insulating film 101 provided with an interconnect trench pattern, and an unnecessary portion of the metal film is removed, thereby forming a plurality of metal interconnects 106 buried in the interlayer insulating film 101. The metal interconnects 106 are finished with desired sizes in the central portion of the first region A, and formed smaller than desired at the boundary between the first region A and the second region B. As such, size variations of the metal interconnects 106 are attributed to the non-uniformity in the thickness when applying the second resist film 105.

Note that, in FIG. 5C, the width of the pattern varies depending on the density of the pattern, as the second resist patterns 105A and 105b do, since the amount of exposure is not sufficient in a thicker region of the second resist film 105 as compared to a thinner region, when the second resist film 105 is of a positive type.

In view of the above-described problems, it is an objective of the present disclosure to form a desired pattern regardless of the density of the pattern when double patterning is used in pattern formation.

In order to achieve the objective, the present disclosure provides a pattern formation method including the steps of forming a dummy pattern from a first resist film in a region with a low-density pattern, which is in contact with a region with a high-density pattern, and then, filling the dummy pattern with a second resist film.

Specifically, a pattern formation method according to the present disclosure includes the steps of (a) forming a first resist film on a substrate; (b) selectively irradiating the first resist film with first exposure light and performing first development, thereby forming a first pattern in a first region including an interconnect trench pattern and forming a first dummy pattern in a second region connected to the first region and having a pattern density lower than that of the interconnect trench pattern; (c) hardening the first resist film in which the first pattern and the first dummy pattern are formed; (d) forming a second resist film on the hardened first resist film, after step (c) has been performed; and (e) selectively irradiating the second resist film with second exposure light and performing second development, thereby forming a second pattern in the first region, wherein in step (e), an opening made of the first pattern and the second pattern and including the interconnect trench pattern is formed in the first region, whereas in the second region, an opening in the first dummy pattern is filled with the second resist film.

According to the pattern formation method of the present disclosure, in step (e), the opening made of the first pattern and the second pattern and including interconnect trench pattern is formed in the first region, whereas in the second region, the opening in the first dummy pattern is filled with the second resist film. As such, since the second resist film formed in the second region fills the first dummy pattern, the thickness of the second resist film cannot be larger at a boundary between the first region and the second region than in the first region. Therefore, the second pattern is finished with a desired size in the first region.

In the pattern formation method of the present disclosure, in step (e), a second dummy pattern having an opening in which the first resist film is exposed may be formed on the first resist film in the second region.

As such, even when the opening is formed in the second dummy pattern, the substrate is not exposed as long as the opening is formed on the first resist film, and thus, an unnecessary pattern (dummy pattern) is not formed in the substrate.

In the pattern formation method of the present disclosure, in step (b), an opening may be formed, as the first dummy pattern in the second region, in an outer peripheral portion of the first region.

In the pattern formation method of the present disclosure, the opening of the first dummy pattern may be connected to the opening of the first pattern.

In the pattern formation method of the present disclosure, the second region may be located inside a boundary between the first region and the second region at a distance of 2T where T is a thickness of the second resist film.

In this case, in step (e), the second dummy pattern may be formed in the entire second region.

Also, in this case, in step (b), the first dummy pattern may have an opening ratio within or equal to ±20% of an opening ratio of the first pattern.

Furthermore, in this case, at least one of the first dummy pattern and the second dummy pattern may be formed in a third region located outside the second region.

Note that, the "dummy pattern" represents a pattern not existing when designing a circuit and not functioning as an interconnect which allows a current to flow with electrical characteristics. The dummy pattern may be formed in any shape.

As described above, according to the pattern formation method of the present disclosure, a resist pattern with a desired size can be formed in second and subsequent exposure in double patterning, regardless of the density of a resist pattern which is formed first.

BRIEF DESCRIPTION OF THE DRAWINGS

FIGS. 1A-1E are cross-sectional views illustrating a pattern formation method according to a first example embodiment in order of steps.

FIGS. 2A-2C are top views illustrating the pattern formation method according to the first example embodiment in order of steps.

FIGS. 4A-4C are top views illustrating a pattern formation method according to a second example embodiment in order of steps.

DETAILED DESCRIPTION

First Example Embodiment

A pattern formation method according to a first example embodiment will be described below with reference to FIGS. 1A-1E and 2A-2C.

In the first example embodiment, a litho-process-litho-etch (LPLE) process of double patterning is used as the pattern formation method.

Figure 1A:
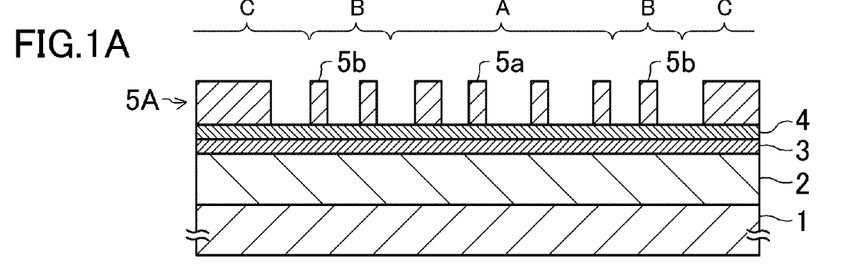
FIG. 1A is a cross-sectional view taken along the line Ia-Ia of FIG. 2A.

First, as shown in FIG. 1A, an interlayer insulating film 2, which contains silicon dioxide ($SiO_2$) as a main component, is deposited on a substrate 1 made of, e.g., silicon (Si). A known hard mask formation film 3 and an anti-reflection film 4 are formed on the deposited interlayer insulating film 2. Then, a first resist film is formed on the anti-reflection film 4 by applying resist, and is subjected to first exposure and first development to form a first resist pattern 5A from the first resist film. The first resist pattern 5A includes a first pattern 5a formed in a first region A having a relatively high-density pattern, and a dummy pattern 5b connected to the first region A and formed in a second region B having a density lower than the first region A. In this embodiment, the first region A having the relatively high-density pattern is an interconnect pattern formation region. The second region B having the density lower than the first region A surrounds the first region A, and is located inside a boundary between the first region A and the second region B at a distance of 2T where T is a thickness of the resist film. In this embodiment, a third region C is further provided outside the second region B.

In the first example embodiment, the minimum size of the first resist pattern 5A is 32 nm, and the thickness of the second resist film is 100 nm. Thus, the second region B is located in a range 2T nm, i.e., 200 nm which is twice the thickness, from the boundary between the first region A and the second region B. There is no interconnect pattern in the second region B. A dummy pattern 5b is newly formed in the second region B. The dummy pattern 5b may be in any form as viewed from above.

Figure 2A:
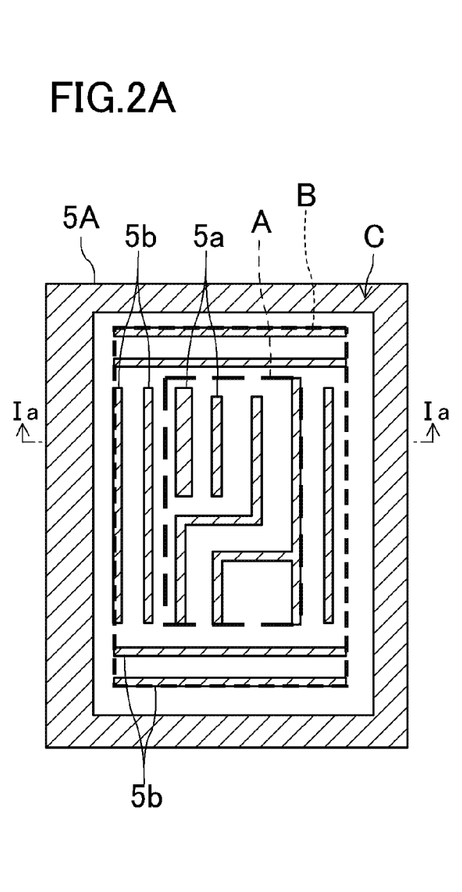
FIG. 2A is a top view of a first resist pattern after first exposure.

As shown in FIG. 2A which corresponds to FIG. 1A, for example, the dummy pattern 5b includes straight lines extending in a direction similar to the first pattern 5a in the first region A, where two of the lines are located on each of a top, bottom, right and left sides; and space in the remaining part. The dummy pattern 5b formed in the first exposure has preferably an opening ratio within or equal to ±20% of an opening ratio of the first region A in the first exposure. As such, the opening ratio of the second region B is close to the opening ratio of the first region A, thereby reducing the problem that the second resist film applied before second exposure has a too large or too small thickness.

After that, the first resist pattern 5A is hardened by predetermined heat treatment.

Figure 1B:
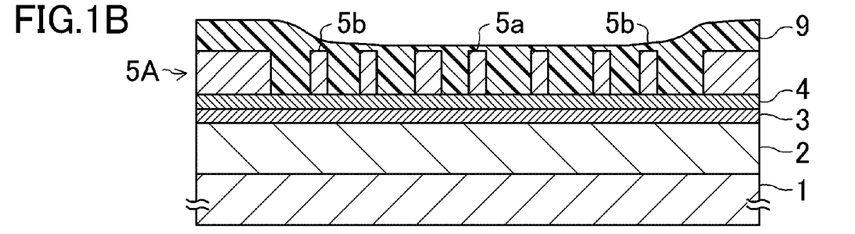

Next, as shown in FIG. 1B, a second resist film 9 is formed on the hardened first resist pattern 5A by applying resist. At this time, part of the second resist film 9 formed in the second region B enters the opening of the first resist pattern 5A which is a foundation layer. As a result, the second resist film 9 has a different thickness at the boundary between the second region B and the third region C, and thus, the surface of the second resist film 9 has a uniform height from the surface of the anti-reflection film 4 in the entire first region A. That is, in the first region A, the second resist film 9 has a uniform thickness in the space of the first resist pattern 5A.

Figure 1C:
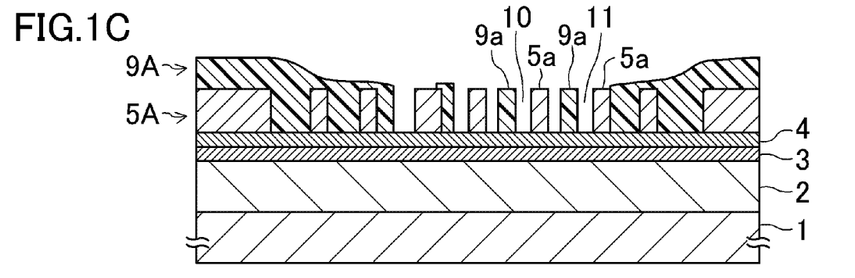
FIG. 1C is a cross-sectional view taken along the line Ic-Ic of FIG. 2C.
Figure 1D:
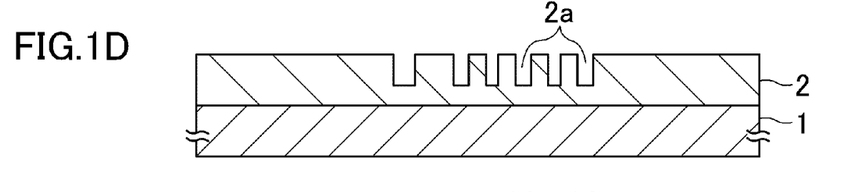

Then, as shown in FIG. 1C, the second resist film 9 are subjected to second exposure and second development to form the second resist pattern 9A from the second resist film 9. At this time, a first opening pattern 10 is formed in the central portion of the first region A, from a second pattern 9a of the second resist pattern 9A and the first pattern 5a of the first resist pattern 5A. At the same time, a second opening pattern 11 is formed at the boundary between the first region A and the second region B, from the second pattern 9a of the second resist pattern 9A and the first pattern 5a of the first resist pattern 5A. Furthermore, the first opening pattern 10 formed in the central portion of the first region A, and the second opening pattern 11 formed at the boundary are both finished with desired sizes. One of the features of this example embodiment is that a dummy opening pattern for the second resist pattern 9A is not formed in the opening of the dummy pattern 5b in the first resist pattern 5A.

Next, the anti-reflection film 4 and the hard mask formation film 3 are etched using the first resist pattern 5A and the second resist pattern 9A as masks to form a hard mask (not shown) from the hard mask formation film 3. Then, the interlayer insulating film 2 is etched with the formed hard mask to form a plurality of interconnect trench patterns 2a in the upper portion of the interlayer insulating film 2. After that, the hard mask is removed, thereby obtaining the state shown in FIG. 1D. At this time, the interconnect trench patterns 2a formed in the first region A are finished with desired sizes both in the central portion and at the boundary.

Figure 1E:
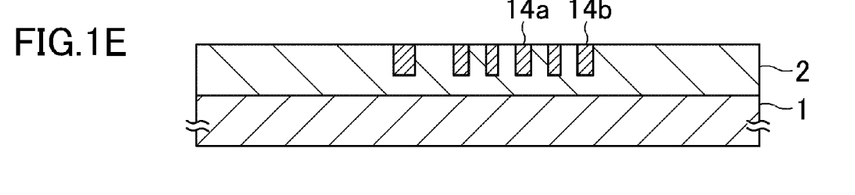

Then, as shown in FIG. 1E, a metal film of copper (Cu), aluminum (Al), or the like for interconnect formation is formed on the interlayer insulating film 2 provided with the interconnect trench patterns 2a by plating, physical vapor deposition (PVD), chemical vapor deposition (CVD), or the like to fill the interconnect trench patterns 2a. After that, an unnecessary portion of the metal film is removed by chemical mechanical polishing (CMP) etc. to form a plurality of metal interconnects 14a and 14b filling the interlayer insulating film 2.

In the first example embodiment, the first metal interconnects 14a formed in the central portion of the first region A, and the second metal interconnects 14b formed near the boundary between the first region A and the second region B, which is located within 200 nm outside, are both finished with desired sizes. Moreover, as shown in FIG. 1C, in this example embodiment, the dummy pattern 5b formed in the first resist pattern 5A is filled with the second resist film 9, and thus, an unnecessary dummy interconnect is not formed in the interlayer insulating film 2.

Next, the pattern formation method according to the first example embodiment will be described with reference to FIGS. 2A-2C and 3.

Figure 3:
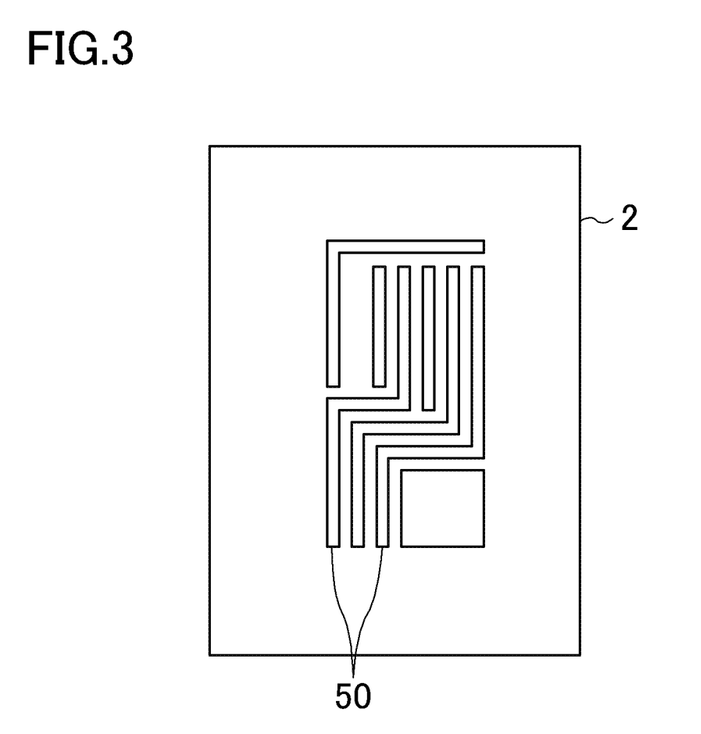
FIG. 3 is a top view illustrating an ideal state of a metal interconnect pattern formed by the two exposure steps.

FIG. 3 is a top view illustrating a structure of a metal interconnect pattern 50 in an ideal state formed by two exposure steps. As shown in FIG. 3, interconnects are formed relatively densely in the metal interconnect pattern 50. No other interconnect is provided around the interconnect pattern. When such an interconnect pattern is formed by a litho-process-litho-etch (LPLE) process of double patterning, a resist pattern needs to be divided into two and formed by two exposure steps.

Figure 2B:
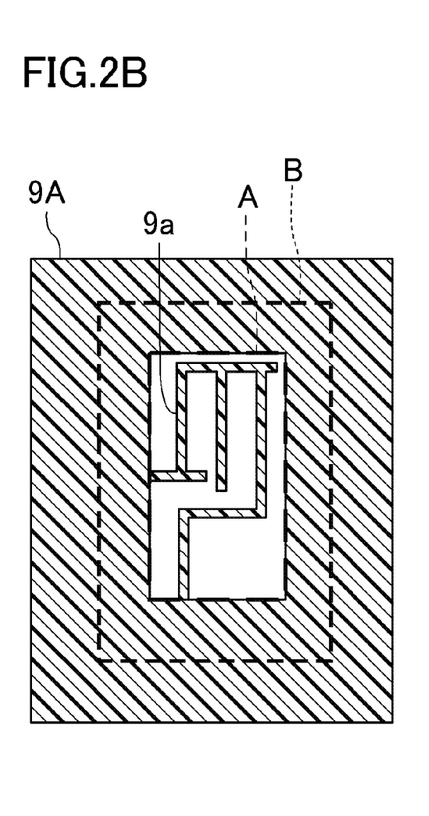
FIG. 2B is a top view of a second resist pattern after second exposure.
Figure 2C:
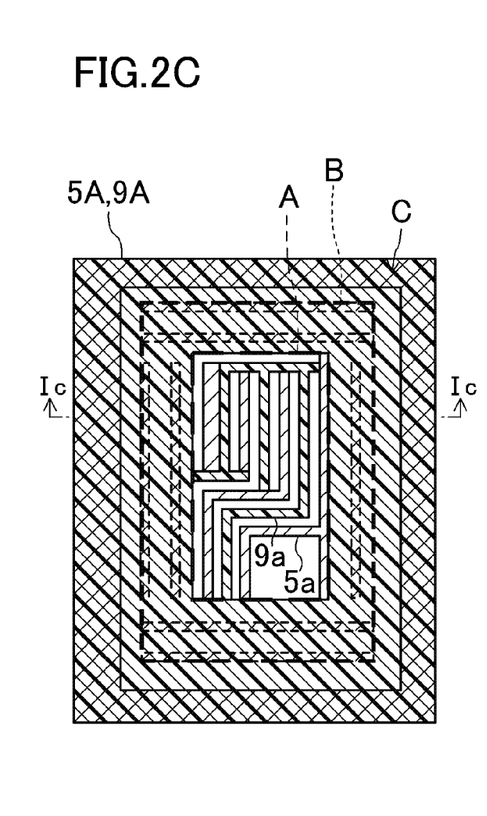
FIG. 2C is a top view of the superimposed first and second resist patterns after the second exposure.

In the first example embodiment, the first resist pattern 5A shown in FIG. 2A and the second resist pattern 9A shown in FIG. 2B are superimposed to form a resist pattern shown in FIG. 2C after the second exposure.

As shown in FIG. 2A, the first pattern 5a formed after the first exposure and forming the first resist pattern 5A in the first region A is provided with a desired size. In the second region B, the dummy pattern 5b forming in the first resist pattern 5A is provided.

Furthermore, as shown in FIG. 2A, the opening of the dummy pattern 5b formed in the second region B may be connected to the opening of the first pattern 5a formed in the first region A. With this structure, there is no resist at the boundary between the first region A and the second region B, thereby improving the uniformity in the film thickness in the first region A in a succeeding process for applying the second resist film 9.

Note that the first resist pattern 5A is formed in the third region C located in an outer peripheral portion of the dummy pattern 5b formed in the second region B.

Next, FIG. 2B is a top view illustrating a structure of the second resist pattern 9A after the second exposure and the second development. The first resist pattern 5A is not shown in the figure for convenience of explanation. FIG. 2C illustrates the state where the first resist pattern 5A and the second resist pattern 9A are superimposed. As shown in FIG. 2B, the entire second pattern 9a of the second resist pattern 9A in the first region A is formed with a desired size including the vicinity of the boundary. This is because, as shown in FIGS. 1B and 2A, the second resist film 9 enters the opening of the dummy pattern 5b of the first resist pattern 5A formed in the second region B, thereby rendering the thickness of the second resist film 9 almost uniform in the first region A.

As shown in FIG. 2C, in the first region A, the openings made of the first pattern 5a of the first resist pattern 5A and the second pattern 9a of the second resist pattern 9A eventually form a metal interconnect pattern. The openings of the first pattern 5a and the second pattern 9a are finished with desired sizes as described above. The dummy pattern 5b of the first resist pattern 5A formed in the second region B by the first exposure and first development is covered by the second resist pattern 9A formed in the second region B after the first exposure and first development. That is, the opening of the dummy pattern 5b of the first resist pattern 5A is filled with the second resist pattern 9A. As a result, there is no opening in the dummy pattern 5b formed in the second region B.

After that, as described above with reference to FIG. 1, the interlayer insulating film 2 is etched with the hard mask, to which the metal interconnect pattern is transferred, to form the interconnect trench patterns 2a. Then, the formed interconnect trench patterns 2a are filled with the metal film, and the excess metal film is removed, thereby obtaining a metal interconnect pattern similar to the metal interconnect pattern 50 shown in FIG. 3. At this time, the obtained metal interconnect pattern is finished as designed, and an unnecessary dummy metal interconnect is not formed. Therefore, an increase in parasitic capacitance among interconnects caused by an unnecessary dummy metal interconnects can be mitigated.

Second Example Embodiment

A pattern formation method according to a second example embodiment will be described below with reference to FIGS. 4A-4E. In FIGS. 4A-4E, the same reference characters as those shown in FIGS. 1A-1E and 2A-2C are used to represent equivalent elements, and the explanation thereof will be omitted.

Figure 4A:
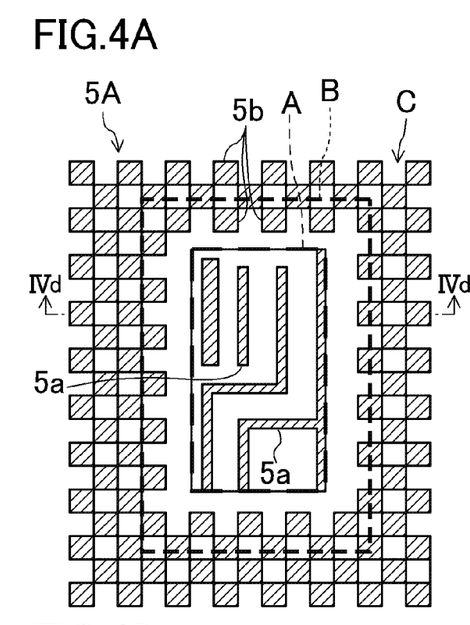
FIG. 4A is a top view of a first resist pattern after first exposure.
Figure 4B:
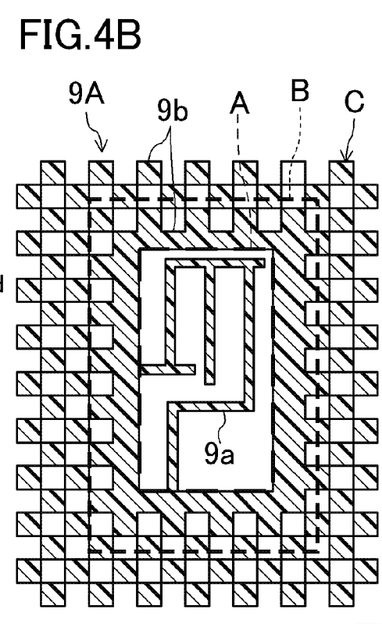
FIG. 4B is a top view of a second resist pattern after second exposure.
Figure 4C:
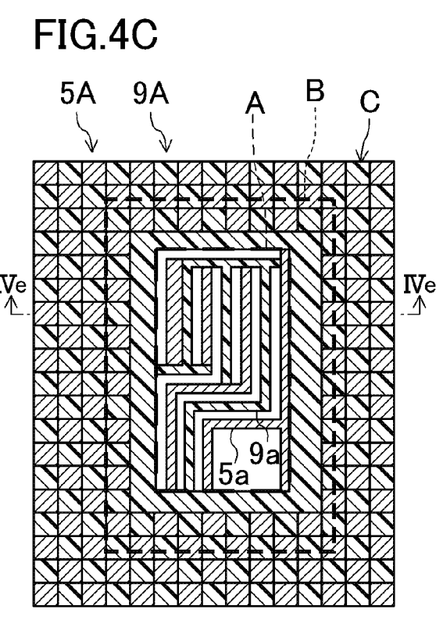
FIG. 4C is a top view of the superimposed first and second resist patterns after the second exposure.
Figure 4D:
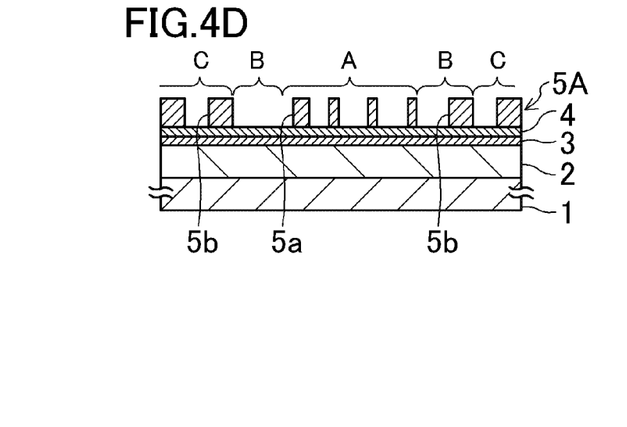
FIG. 4D is a cross-sectional view taken along the line IVd-IVd of FIG. 4A.
Figure 4E:
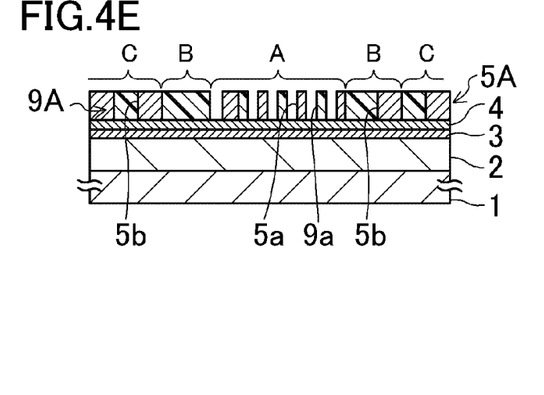
FIG. 4E is a cross-sectional view taken along the line IVe-IVe of FIG. 4C.

As shown in FIGS. 4A and 4D, in the second example embodiment, the dummy pattern 5b having openings alternately in up, down, right and right directions, i.e., in a so-called checkered pattern, is formed in the entire second region B and the entire third region C located outside the second region B of the first resist pattern 5A.

As such, by forming the dummy pattern 5b in the first resist pattern 5A in the entire second region B and the entire third region C, a flare in exposure and influence in development caused by the dummy pattern 5b can be close to the same level as those caused by the first pattern 5a formed in the first region A, as described later. At this time, the dummy pattern 5b formed in the second region B preferably has an opening ratio within or equal to ±20% of an opening ratio of the first pattern 5a in the first region A. As such, by setting the opening ratio of the dummy pattern 5b in the second region B close to the opening ratio of the first pattern 5a in the first region A, an extreme increase or decrease in the thickness of the second resist film 9 applied before the second exposure can be mitigated.

Furthermore, in the first resist pattern 5A, the openings of the dummy pattern 5b formed in the second region B may be connected to the opening of the first pattern 5a formed in the first region A. With this structure, there is no resist pattern at the boundary between the first region A and the second region B, thereby improving the uniformity in the film thickness in the first region A in a succeeding process for applying the second resist film 9.

Next, FIG. 4B is a top view illustrating a structure of the second resist pattern 9A after the second exposure and the second development. The first resist pattern 5A is not shown in the figure for convenience of explanation. FIG. 4C illustrates the state where the first resist pattern 5A and the second resist pattern 9A are superimposed. As shown in FIG. 4B, the second resist pattern 9A formed in the second region B and the third region C fills the openings of the checkered dummy pattern 5b in the first resist pattern 5A formed in the second region B and the third region C. Specifically, the second resist pattern 9A formed in the second region B and the third region C has, as a dummy pattern, a checkered pattern which is inversion of the dummy pattern 5b of the first resist pattern 5A. That is, the second resist pattern 9A has the plurality of openings, which are formed only in the first resist film. Since the anti-reflection film 4 is necessarily covered with either one of the first resist pattern 5A and the second resist pattern 9A, and the anti-reflection film 4 is not exposed. Thus, an unnecessary trench (dummy trench) is not formed in the interlayer insulating film 2 by etching. At this time, similar to the first example embodiment, the second pattern 9a of the second resist pattern 9A in the first region A is formed with a desired size including the boundary between the first region A and the second region B. This is because, due to the openings of the dummy pattern 5b of the first resist pattern 5A formed in the second region B, the first resist pattern 5A and the second resist pattern 9A have the same thicknesses in the first region A and the second region B.

Note that, the second resist pattern 9A according to the second example embodiment is not necessarily the inversion of the first resist pattern 5A in the second region B and the third region C. What is required is that the openings of the dummy pattern 5b of the first resist pattern 5A are filled. Therefore, if the openings are formed in the second resist pattern 9A in the second region B and the third region C, the openings need to be formed in the resist film in the first resist pattern 5A.

By forming a plurality of openings, which are here the openings in the checkered pattern, in the second resist pattern 9A, the opening ratio of the second resist pattern 9A in the second region B and the third region C can be close to the opening ratio of the resist patterns 5A and 9A in the first region A. Thus, influence of size variations caused by a flare occurring in exposure can be close to the same level as that in the first exposure. As a result, the design size in the second exposure can be close to that in the first exposure.

Furthermore, by providing the plurality of openings in the second resist pattern 9A, uniformity in dissolution in the development can be improved. This reduces size variations caused by a difference in concentration of a developer between a portion in which the resist film is dissolved in development, i.e., the region of the resist film provided with many openings, and a portion in which the resist film is less dissolved, i.e., the region provided with few openings. As a result, the first pattern 5a and the second pattern 9a formed in the first region A can be further close to predetermined sizes.

As shown in FIG. 4C, in the first region A, the openings made of the first pattern 5a of the first resist pattern 5A, and the second pattern 9a of the second resist pattern 9A eventually form metal interconnect patterns. The openings of the first pattern 5a and the second pattern 9a are finished with desired sizes, as described above. Then, the openings of the dummy pattern 5b of the first resist pattern 5A formed in the second region B and the third region C by the first exposure and the first development are filled with the second resist pattern 9A formed in the second region B and the third region C. That is, there is no opening in the dummy pattern 5b in the second region B and the third region C, which is covered by the second resist pattern 9A.

After that, as described above, the interlayer insulating film 2 is etched with the hard mask, to which the metal interconnect pattern is transferred, to form interconnect trench patterns 2a. Then, the formed interconnect trench patterns 2a are filled with the metal film, and the excess metal film is removed, thereby obtaining a metal interconnect pattern similar to the metal interconnect pattern 50 shown in FIG. 3. At this time, the obtained metal interconnect pattern is finished as designed, and an unnecessary dummy metal interconnect is not formed. Therefore, an increase in parasitic capacitance among interconnects caused by an unnecessary dummy metal interconnect can be mitigated.

Note that, in the second example embodiment, the checkered dummy pattern 5b and second resist pattern 9A formed in the second region B and the third region C may be formed only in the second region B. When the checkered pattern is formed from the second region B to the third region C located outside the second region B, the uniformity in the dissolution in the development can be improved, thereby improving the uniformity in the size of a desired pattern.

The pattern formed in the third region C may be both or either of the dummy pattern 5b and the second resist pattern 9A.

As described above, in the pattern formation method according to the present disclosure, a desired pattern can be formed in double patterning regardless of the density of the pattern, and is thus, particularly useful as a pattern formation method, etc. for manufacturing miniaturized devices of a 22 nm or later generation.

What is claimed is:

1. A pattern formation method, comprising the steps of:
   (a) forming a first resist film on a substrate;
   (b) selectively irradiating the first resist film with first exposure light and performing first development, thereby forming a first pattern in a first region including an interconnect trench pattern and forming a first dummy pattern in a second region connected to the first region and having a pattern density lower than that of the interconnect trench pattern;
   (c) hardening the first resist film in which the first pattern and the first dummy pattern are formed;
   (d) forming a second resist film on the hardened first resist film, after step (c) has been performed; and
   (e) selectively irradiating the second resist film with second exposure light and performing second development, thereby forming a second pattern in the first region, wherein
   in step (e), an opening made of the first pattern and the second pattern and including the interconnect trench pattern is formed in the first region, whereas in the second region, an opening in the first dummy pattern is filled with the second resist film.

2. The pattern formation method of claim 1, wherein in step (e), a second dummy pattern having an opening in which the first resist film is exposed is formed on the first resist film in the second region.

3. The pattern formation method of claim 1, wherein in step (b), an opening is formed, as the first dummy pattern in the second region, in an outer peripheral portion of the first region.

4. The pattern formation method of claim 1, wherein the opening of the first dummy pattern is connected to the opening of the first pattern.

5. The pattern formation method of claim 1, wherein the second region is inside a distance 2T, where T is a thickness of the second resist film, from a boundary between the first region and the second region.

6. The pattern formation method of claim 5, wherein in step (e), a second dummy pattern is formed in the entire second region.

7. The pattern formation method of claim 5, wherein in step (b), the first dummy pattern has an opening ratio within or equal to ±20% of an opening ratio of the first pattern.

8. The pattern formation method of claim 5, wherein at least one of the first dummy pattern and the second dummy pattern is formed in a third region located outside the second region.

\* \* \* \* \*